US009349975B2

(12) United States Patent
Coe-Sullivan et al.

(10) Patent No.: US 9,349,975 B2
(45) Date of Patent: May 24, 2016

(54) COMPOSITE INCLUDING NANOPARTICLES, METHODS, AND PRODUCTS INCLUDING A COMPOSITE

(75) Inventors: Seth Coe-Sullivan, Belmont, MA (US);
Maria J. Anc, Groveland, MA (US);
Jonathan S. Steckel, Bedford, MA (US)

(73) Assignee: QD VISION, INC., Lexington, MA (US)

( * ) Notice: Subject to any disclaimer, the term of this patent is extended or adjusted under 35 U.S.C. 154(b) by 468 days.

(21) Appl. No.: 12/381,524

(22) Filed: Mar. 12, 2009

(65) Prior Publication Data

US 2009/0283743 A1    Nov. 19, 2009

Related U.S. Application Data

(63) Continuation of application No. PCT/US2007/019797, filed on Sep. 12, 2007.

(60) Provisional application No. 60/825,375, filed on Sep. 12, 2006, provisional application No. 60/825,381, filed on Sep. 12, 2006.

(51) Int. Cl.
*H01L 51/54* (2006.01)
*H01L 51/50* (2006.01)
*B82Y 20/00* (2011.01)
*B82Y 30/00* (2011.01)

(52) U.S. Cl.
CPC ............ *H01L 51/5048* (2013.01); *B82Y 20/00* (2013.01); *B82Y 30/00* (2013.01); *H01L 51/5052* (2013.01); *Y10T 428/24802* (2015.01); *Y10T 428/25* (2015.01); *Y10T 428/252* (2015.01)

(58) Field of Classification Search
None
See application file for complete search history.

(56) References Cited

U.S. PATENT DOCUMENTS

| | | | |
|---|---|---|---|
| 4,769,292 A | 9/1988 | Tang et al. |
| 4,791,881 A | 12/1988 | Iwasaki |
| 4,844,002 A | 7/1989 | Yasui et al. |
| 4,948,635 A | 8/1990 | Iwasaki |
| 5,266,114 A | 11/1993 | Iwasaki |
| 5,537,000 A | 7/1996 | Alivisatos et al. |
| 5,783,292 A | 7/1998 | Tokito et al. |
| 6,005,707 A | 12/1999 | Berggren et al. |
| 6,054,495 A | 4/2000 | Markowitz et al. |
| 6,069,442 A | 5/2000 | Hung et al. |
| 6,139,585 A | 10/2000 | Li |
| 6,236,060 B1 | 5/2001 | Chan et al. |
| 6,242,076 B1 | 6/2001 | Andriash |
| 6,251,303 B1 | 6/2001 | Bawendi et al. |
| 6,303,238 B1 | 10/2001 | Thompson et al. |
| 6,319,426 B1 | 11/2001 | Bawendi et al. |
| 6,322,901 B1 | 11/2001 | Bawendi et al. |
| 6,501,091 B1 | 12/2002 | Bawendi et al. |
| 6,506,564 B1 | 1/2003 | Mirkin et al. |
| 6,512,070 B2 | 1/2003 | Hawker et al. |
| 6,515,314 B1 | 2/2003 | Duggal et al. |
| 6,593,690 B1 | 7/2003 | McCormick et al. |
| 6,605,373 B2 | 8/2003 | Woo et al. |
| 6,695,978 B2 | 2/2004 | Worrall et al. |
| 6,717,358 B1 | 4/2004 | Liao et al. |
| 6,806,374 B2 | 10/2004 | Heeney et al. |
| 6,824,706 B2 | 11/2004 | Heeney et al. |
| 6,853,013 B2 | 2/2005 | Hirai et al. |
| 6,864,339 B2 | 3/2005 | Uckert |
| 6,864,352 B2 | 3/2005 | Wang et al. |
| 6,965,197 B2 | 11/2005 | Tyan et al. |
| 7,065,285 B2 | 6/2006 | Chen et al. |
| 7,115,216 B2 | 10/2006 | Carter et al. |
| 7,132,787 B2 | 11/2006 | Ozkan et al. |
| 7,160,613 B2 | 1/2007 | Bawendi et al. |
| 7,189,771 B2 | 3/2007 | Hsu |
| 7,200,318 B2 | 4/2007 | Banin et al. |
| 7,253,452 B2 | 8/2007 | Steckel et al. |
| 7,265,037 B2 | 9/2007 | Yang et al. |
| 7,294,861 B2 | 11/2007 | Schardt et al. |
| 7,332,211 B1 | 2/2008 | Bulovic et al. |
| 7,390,568 B2 | 6/2008 | Kim et al. |
| 7,545,051 B2 | 6/2009 | Yang et al. |
| 7,695,150 B2 | 4/2010 | Dejima et al. |
| 7,989,153 B2 | 8/2011 | Skipor et al. |

(Continued)

FOREIGN PATENT DOCUMENTS

| | | |
|---|---|---|
| JP | H060301071 | 10/1994 |
| JP | 2004172102 | 6/2004 |

(Continued)

OTHER PUBLICATIONS

Anikeeva, et al., "Electroluminescence from a Mixed Red-Green-Blue Colloidal Quantum Dot Monolayer", Nano Lett. (2007) vol. 7, No. 8, pp. 2196-2200, with Supporting Information.

Coe, et al., "Electroluminescence from Single Monolayers of Nanocrystals in Molecular Organic Devices", Nature (2002) vol. 420, pp. 800-803.

Coe-Sullivan, "Hybrid Organic/Quantum Dot Thin Film Structures and Devices", Ph.D. Thesis, Jun. 2005, Massachusetts Institute of Technology.

(Continued)

*Primary Examiner* — Andrew K Bohaty

(57) ABSTRACT

A composite comprising a first layer comprising a first material including nanoparticles dispersed therein, wherein the first material comprises a material capable of transporting charge, a second layer comprising a second material, and a backing element that is removably attached to the uppermost layer of the composite or the lowermost layer of the composite. In certain preferred embodiments, a least a portion of the nanoparticles include a ligand attached to a surface thereof. Methods are also disclosed. Products including a composite is further provided. Composite materials can be particularly well-suited for use, for example, in products useful in various optical, electronic, optoelectronic, magnetic, or catalytic devices.

18 Claims, No Drawings

(56) References Cited

U.S. PATENT DOCUMENTS

| | | | |
|---|---|---|---|
| 8,277,942 B2 | 10/2012 | Kim et al. | |
| 8,618,561 B2 | 12/2013 | Coe-Sullivan | |
| 2002/0047560 A1 | 4/2002 | Lee et al. | |
| 2002/0187347 A1 | 12/2002 | Halas et al. | |
| 2003/0003300 A1 | 1/2003 | Korgel et al. | |
| 2003/0041444 A1 | 3/2003 | Debe et al. | |
| 2003/0042850 A1 | 3/2003 | Bertram et al. | |
| 2003/0094626 A1 | 5/2003 | Duggal et al. | |
| 2003/0107313 A1 | 6/2003 | Andriessen | |
| 2003/0152703 A1 | 8/2003 | Hammond et al. | |
| 2004/0023010 A1* | 2/2004 | Bulovic et al. | 428/209 |
| 2004/0027062 A1 | 2/2004 | Shiang et al. | |
| 2004/0027327 A1 | 2/2004 | LeCain et al. | |
| 2004/0028875 A1 | 2/2004 | Van Rijn et al. | |
| 2004/0166235 A1 | 8/2004 | Fujii et al. | |
| 2004/0206942 A1* | 10/2004 | Hsu | 252/500 |
| 2004/0265492 A1 | 12/2004 | Free et al. | |
| 2005/0035346 A1* | 2/2005 | Bazan et al. | 257/40 |
| 2005/0045269 A1* | 3/2005 | Tateishi | 156/230 |
| 2005/0048295 A1 | 3/2005 | Kim et al. | |
| 2005/0054004 A1 | 3/2005 | Alivisatos et al. | |
| 2005/0058416 A1 | 3/2005 | Hoon Lee et al. | |
| 2005/0066883 A1 | 3/2005 | Dubrow et al. | |
| 2005/0069644 A1 | 3/2005 | Hsieh et al. | |
| 2005/0095736 A1* | 5/2005 | Padiyath et al. | 438/22 |
| 2005/0098205 A1 | 5/2005 | Roscheisen et al. | |
| 2005/0116621 A1 | 6/2005 | Bellmann et al. | |
| 2005/0118403 A1 | 6/2005 | Anazawa et al. | |
| 2005/0126628 A1 | 6/2005 | Scher et al. | |
| 2005/0147849 A1 | 7/2005 | Wolk | |
| 2005/0157157 A1 | 7/2005 | Tsukamoto et al. | |
| 2005/0163934 A1 | 7/2005 | Ruschak et al. | |
| 2005/0186405 A1 | 8/2005 | Jeong et al. | |
| 2005/0191448 A1 | 9/2005 | Suh et al. | |
| 2005/0218377 A1 | 10/2005 | Lawandy | |
| 2005/0230356 A1 | 10/2005 | Empedocles et al. | |
| 2005/0241573 A1 | 11/2005 | Ogawa et al. | |
| 2005/0249901 A1 | 11/2005 | Yializis et al. | |
| 2005/0258418 A1 | 11/2005 | Steckel et al. | |
| 2005/0274944 A1 | 12/2005 | Jang et al. | |
| 2006/0003097 A1 | 1/2006 | Andres et al. | |
| 2006/0042685 A1 | 3/2006 | Wang | |
| 2006/0043361 A1* | 3/2006 | Lee et al. | 257/40 |
| 2006/0063029 A1 | 3/2006 | Jang et al. | |
| 2006/0063351 A1 | 3/2006 | Jain | |
| 2006/0196375 A1 | 9/2006 | Coe-Sullivan et al. | |
| 2006/0199313 A1 | 9/2006 | Harting et al. | |
| 2006/0270233 A1 | 11/2006 | Xia et al. | |
| 2007/0004065 A1 | 1/2007 | Schardt et al. | |
| 2007/0034833 A1 | 2/2007 | Parce et al. | |
| 2007/0045777 A1 | 3/2007 | Gillies et al. | |
| 2007/0077594 A1 | 4/2007 | Hikmet et al. | |
| 2007/0096078 A1 | 5/2007 | Lee et al. | |
| 2007/0102694 A1 | 5/2007 | Drndic et al. | |
| 2007/0103068 A1 | 5/2007 | Bawendi et al. | |
| 2007/0137693 A1 | 6/2007 | Forrest et al. | |
| 2007/0151592 A1 | 7/2007 | Forrest et al. | |
| 2007/0162263 A1 | 7/2007 | Forrest | |
| 2008/0001167 A1 | 1/2008 | Coe-Sullivan et al. | |
| 2008/0030126 A1 | 2/2008 | Scholz et al. | |
| 2008/0237540 A1 | 10/2008 | Dubrow | |
| 2009/0017268 A1 | 1/2009 | Skipor et al. | |
| 2009/0039764 A1 | 2/2009 | Cho et al. | |
| 2009/0181478 A1 | 7/2009 | Cox et al. | |
| 2009/0208753 A1 | 8/2009 | Coe-Sullivan et al. | |
| 2009/0215208 A1 | 8/2009 | Coe-Sullivan et al. | |
| 2009/0215209 A1 | 8/2009 | Anc et al. | |
| 2009/0278141 A1 | 11/2009 | Coe-Sullivan et al. | |
| 2009/0280586 A1 | 11/2009 | Coe-Sullivan et al. | |
| 2009/0283742 A1 | 11/2009 | Coe-Sullivan et al. | |
| 2009/0283778 A1 | 11/2009 | Coe-Sullivan et al. | |
| 2009/0286338 A1 | 11/2009 | Coe-Sullivan et al. | |
| 2010/0051901 A1 | 3/2010 | Kazlas et al. | |
| 2010/0068468 A1 | 3/2010 | Coe-Sullivan et al. | |
| 2010/0132770 A1 | 6/2010 | Beatty et al. | |
| 2010/0134520 A1 | 6/2010 | Coe-Sullivan et al. | |
| 2010/0167011 A1 | 7/2010 | Dubrow | |
| 2010/0283014 A1 | 11/2010 | Breen et al. | |
| 2011/0245533 A1 | 10/2011 | Breen et al. | |

FOREIGN PATENT DOCUMENTS

| | | |
|---|---|---|
| JP | 2004253175 | 9/2004 |
| JP | 2004303592 | 10/2004 |
| JP | 2005340195 | 12/2005 |

OTHER PUBLICATIONS

Coe-Sullivan, et al., "Large-area ordered quantum-dot monolayers via phase separation during spin-casting", Adv. Funct. Mater. 15 (7), pp. 1117-1124, (2005).

Coe-Sullivan, et al., "Method for fabrication of saturated RGB quantum dot light emitting devices", Proc. of SPIE (2005) vol. 5739, pp. 108-115.

Coe-Sullivan, et al., "Tuning the Performance of Hybrid Organic/Inorganic Quantum Dot Light Emitting Devices", Organic Electronics (2003) vol. 4, pp. 123-130.

PCT Search Report and Written Opinion for PCT/US2007/008721 mailed Aug. 8, 2008. (PCT/US2007/008721 is the parent of copending U.S. Appl. No. 12/287,145, filed Oct. 6, 2008.).

PCT Search Report and Written Opinion for PCT/US2007/008705 mailed Apr. 3, 2008. (PCT/US2007/008705 is the parent of copending U.S. Appl. No. 12/287,142, filed Oct. 6, 2008.).

PCT Search Report and Written Opinion for PCT/US2007/014706 mailed Jul. 22, 2008. (PCT/US2007/014706 is the parent of copending U.S. Appl. No. 12/317,249, filed Dec. 19, 2008.).

PCT Search Report and Written Opinion for PCT/US2007/019797 mailed Apr. 11, 2008. (PCT/US2007/019797 is the parent of U.S. Appl. No. 12/381,524, which is this case.).

PCT Search Report and Written Opinion for PCT/US2007/024750 mailed Apr. 22, 2008. (PCT/US2007/024750 is the parent of copending U.S. Appl. No. 12/455,144, filed May 28, 2009.).

Dabbousi, et al., "(CdSe) ZnS Core-Shell Quantum Dots: Synthesis and Characterization of a Size Series of Highly Luminescent Nanocrystallites", J. Phys. Chem. 101, 9463, 1997.

Hines M. A., et al.,"Synthesis and Characterization of Strongly Luminescing ZnS-Capped CdSe Nanocrystals", J. Phys. Chem. 1996, 100, pp. 468-471.

Kazlas, et al., "Progress in Developing High Efficiency Quantum Dot Displays", SID Symposium Digest of Technical Papers (May 2007) vol. 38, Issue 1, pp. 856-859.

Kazlas, et al., Poster Presentation, "Progress in Developing High Efficiency Quantum Dot Displays", SID Symposium, May 2007.

Moeller, et al., "Quantum-Dot Light-Emitting Devices for Displays", Information Display (Feb. 2006) pp. 2-6.

Murray, C. B., et al., "Synthesis and Characterization of Monodisperse Nanocrystals and Close-Packed Nanocrystal Assemblies", Annu. Rev. Mater. Sci. 2000, 30, 545.

Murray, et al., "Synthesis and Characterization of Nearly Monodisperse CdE (E=S, Se, Te) Semiconductor Nanocrystallites", J. Am. Chem. Soc., 115:8706 (1993).

Schlamp, et al., "Improved efficiencies in light emitting diodes made with CdSe(CdS) core/shell type nanocrystals and a semiconducting polymer", 1997 American Institute of Physics, J. Appl. Phys. 82 (11), pp. 5837-5842.

Van Embden, et al., "Nucleation and Growth of CdSe Nanocrystals in a Binary Ligand System", Langmuir 2005, 21:10226-10233; published on the Web Oct. 8, 2005.

\* cited by examiner

COMPOSITE INCLUDING NANOPARTICLES, METHODS, AND PRODUCTS INCLUDING A COMPOSITE

This application is a continuation of commonly owned PCT Application No. PCT/US2007/019797 filed 12 Sep. 2007, which was published in the English language as PCT Publication No. WO 2008/033388 on 20 Mar. 2008. The PCT Application claims priority from commonly owned U.S. Application No. 60/825,375 filed 12 Sep. 2006, and U.S. Application No. 60/825,381 filed 12 Sep. 2006. The disclosures of each of the foregoing applications are hereby incorporated herein by reference in their entireties.

TECHNICAL FIELD OF THE INVENTION

The technical field of the invention relates to a composite comprising nanoparticles, methods, and products including a composite.

SUMMARY OF THE INVENTION

In accordance with one aspect of the present invention there is provided a composite comprising a first layer comprising a first material including nanoparticles dispersed therein, wherein the first material comprises a material capable of transporting charge, a second layer comprising a second material disposed over the first layer, and a removably attached backing member disposed on a side of the uppermost layer of the composite or the lowermost layer of the composite. In certain embodiments, at least a portion of the first layer is in direct contact with at least a portion of the second layer.

In certain embodiments, the composite can include other layers below the first layer, between the first layer and second layer, and/or over the second layer.

Advantageously, the present invention can simplify the fabrication of a device by permitting the composite to be transferred to a device substrate thereby eliminating steps related to formation of the composite from the device fabrication process. After removal of the backing element, the composite can be incorporated into a device structure by known techniques, e.g., lamination.

In certain embodiments, the substrate may include other device layers, e.g., electrodes, or other device layers that can underlie the composite.

Examples of a backing element include a web, a film, a tape, a flexible sheet, etc. Examples of materials that can be used as a backing element include plastic, foil, paper, etc. A backing element can comprise, for example, sheets of material, a roll of material, etc. A backing element can have different dimensions. In certain embodiments, a backing element includes Kapton 200E, Kapton 300H, Kapton 500H, PET, TEONEX, etc. In certain embodiments, the backing element is rigid. In certain embodiments, the backing element is flexible. The selection of a backing element can depend upon the contemplated use of the composite to which it is attached.

In certain embodiments, a backing element can be treated (e.g., by application of one or more coatings, is otherwise surface modified (e.g., chemical modification of the surface, etc.)). For example, a surface chemistry layer can be disposed on a backing element to facilitate the removal thereof from the composite. A surface chemistry layer can be applied by physical vapor deposition (PVD), chemical vapor deposition (CVD), or liquid or gas phase coating by a self-assembled monolayer, depending on the desired material surface properties. Selection of a treatment or surface modification for a backing member, if desired, is within the skill of the person of ordinary skill in the art. In certain embodiments, the composite further includes a removable sheet disposed over the side of the composite opposite the backing element.

In certain embodiments, the backing element comprises a sheet that can be readily removed from the first layer.

In certain embodiments, the first material comprises a material capable of transporting holes.

In certain embodiments, the second material comprises a material capable of transporting charge.

In certain embodiments, the second material comprises a material capable of transporting electrons.

In certain embodiments, the second material comprises a material capable of transporting holes.

In certain embodiments, the second material comprises a material capable of blocking at least a portion of charge transport of at least one charge carrier type. In certain embodiments, the second material comprises a material capable of substantially blocking charge transport of at least one charge carrier type.

In certain embodiments, the first material and the second material can be the same. In certain embodiments, the first material and the second material can be different.

In accordance with another aspect of the present invention there is provided a product including the composite of the invention.

In certain embodiments, the first material and/or the second material can comprise a doped material. In certain embodiments, doping can lead to an increase in the conductivity of a layer, which can reduce resistance losses, and can lead to an improved transition of charge between the electrodes and organic material. As used herein, the terms "doping" and "doped" refer to the addition of a second constituent to a base material where the concentration of the second constituent may range from just over zero to almost 100%. In certain embodiments, doping can enhance optical properties of a material. In certain embodiments, doping can reduce conductivity of a phase or a layer.

In certain embodiments, the first material can comprise a doped organic material. In one embodiment, the doped organic material comprises a material that is capable of transporting holes. In one embodiment, the doped organic material comprises a material that is capable of transporting electrons.

In certain embodiments, the second material can comprise a doped organic material. In one embodiment, the doped organic material comprises a material that is capable of transporting holes. In one embodiment, the doped organic material comprises a material that is capable of transporting electrons.

In a further embodiment, the second material can comprise a doped organic material comprising a material that is capable of blocking charge (e.g., holes or electrons).

In certain embodiments, the nanoparticles can comprise a nanocrystal. In certain embodiments, the nanoparticles can comprise one or more metallic nanoparticles. In certain embodiments, the nanoparticles can comprise one or more ceramic nanoparticles. In certain embodiments, the nanoparticles can comprise one or more semiconductor nanoparticles, such as, e.g., semiconductor nanocrystals. In certain embodiments, the nanoparticles can comprise a mixture of nanoparticles having the same or different compositions. A plurality of nanoparticles can comprise a substantially monodisperse population of semiconductor nanoparticles.

In certain embodiments, the nanoparticles comprise one or more semiconductor nanocrystals having a core/shell structure.

In certain preferred embodiments, a least a portion of the nanoparticles include a ligand attached to a surface thereof.

In certain embodiments, the first material is solution processible. In certain embodiments, the first material comprises small molecules. In certain embodiments, the first material comprises a polymeric material. In certain embodiments, the first material comprises a polymer blend. In certain embodiments, the first material comprises a copolymer. In certain embodiments, the first material comprises a blend of a polymer and non-polymer. In certain embodiments, the first material comprises a polymer not including an aromatic group. In certain embodiments, the first material comprises a polymer including one or more aromatic groups. In one embodiment, a solution processible first material comprises an oligomer. In one embodiment, a solution processible first material comprises a polymeric resin.

In certain embodiments, the second material can be solution processible. In certain embodiments, the second material comprises a small molecule. In certain embodiments, the second material comprises a monomer. In certain embodiments, the second material comprises a polymer. In certain embodiments, the second material comprises an oligomer. In certain embodiments, the second material comprises a polymerizable resin. In certain embodiments, the second material comprises a polymerized resin.

In certain embodiments, the second material can be deposited by vapor deposition techniques.

In certain embodiments, a composite comprises a first layer comprising a first material including semiconductor nanocrystals dispersed therein, wherein the first material comprises a material capable of transporting charge, a second layer comprising a second material, and a removably attached backing member disposed on a side of the uppermost layer of the composite or the lowermost layer of the composite. At least a portion of the semiconductor nanocrystals preferably comprise a ligand attached to the surface thereof. More preferably, the ligand has a chemical affinity for the first material.

In certain embodiments, the first material comprises a material capable of transporting holes.

In certain embodiments, the second material comprises a material capable of transporting charge.

In certain embodiments, the second material comprises a material capable of transporting electrons.

In certain embodiments, the second material comprises a material capable of transporting holes.

In certain embodiments, the second material comprises a material capable of blocking at least a portion of charge transport of at least one charge carrier type. In certain embodiments, the second material comprises a material capable of substantially blocking charge transport of at least one charge carrier type.

Composites, after removal of the backing element, can be particularly well-suited for use, for example, in fabricating products useful in various optical, electronic, optoelectronic, magnetic, or catalytic devices.

A method of manufacturing a device comprises depositing a first layer comprising a plurality of nanoparticles and a first material comprising a material capable of transporting charge onto a substrate to form a first layer from the mixture. The first layer can be patterned or unpatterned. A second layer comprising a second material is formed over at least a portion of the first layer. The second layer can be patterned or unpatterned. A backing member is removably attached to one side of the uppermost layer of the composite or the lowermost layer of the composite.

In certain embodiments, the first material comprises a material capable of transporting holes.

In certain embodiments, the second material comprises a material capable of transporting charge.

In certain embodiments, the second material comprises a material capable of blocking at least a portion of charge transport of at least one charge carrier type. In certain embodiments, the second material comprises a material capable of substantially blocking charge transport of at least one charge carrier type.

In certain embodiments, the second material comprises a material capable of transporting electrons.

In certain embodiments, the second material comprises a material capable of transporting holes.

In certain embodiments, the nanoparticles can comprise a nanocrystal. In certain embodiments, the nanoparticles can comprise one or more metallic nanoparticles. In certain embodiments, the nanoparticles can comprise one or more ceramic nanoparticles. In certain embodiments, the nanoparticles can comprise one or more semiconductor nanoparticles, such as, e.g., semiconductor nanocrystals. In certain embodiments, the nanoparticles can comprise a mixture of nanoparticles having the same or different compositions. A plurality of nanoparticles can comprise a substantially monodisperse population of semiconductor nanoparticles.

In certain embodiments, the nanoparticles comprise one or more semiconductor nanocrystals having a core/shell structure.

In certain preferred embodiments, a least a portion of the nanoparticles include a ligand attached to a surface thereof.

In another aspect, a method of forming a layered structure includes selecting a first material comprising a material capable of transporting charge and a nanoparticle which are mutually miscible, dissolving the first material and the nanoparticle in a solvent to form a coating solution, and coating a substrate with the coating solution. Coating a backing element with the coating solution can include spin coating. The nanoparticle can be one of a plurality of nanoparticles dispersed in the first material. After removing the solvent from the coating to form a first layer, a second layer comprising a second material is formed over at least a portion of the first layer. The second layer can be patterned or unpatterned. The temporary substrate comprises the backing element of the composite.

In certain embodiments, the nanoparticle can comprise a nanocrystal. In certain embodiments, the nanoparticle can comprise a metallic nanoparticle. In certain embodiments, the nanoparticle can comprise a ceramic nanoparticle. In certain embodiments, the nanoparticle can comprise a semiconductor nanoparticle, such as, e.g., a semiconductor nanocrystal. In certain embodiments, the first material can include a plurality of nanoparticles. In certain embodiments, a plurality of nanoparticles can comprise a mixture of nanoparticles having the same of different compositions. A plurality of nanoparticles can comprise a substantially monodisperse population of semiconductor nanoparticles.

In certain embodiments, the nanoparticles comprise one or more semiconductor nanocrystals having a core/shell structure.

In certain preferred embodiments, a least a portion of the nanoparticles include a ligand attached to a surface thereof.

Typical conventional thin film deposition of solvated materials involves spin-casting of individual materials to form a layered (e.g., bilayered, trilayered, or other multilayered) structure.

The first layer can comprise a first material including greater than 0.001%, greater than 0.01%, greater than 0.1%, greater than 1%, greater than 5%, greater than 10%, greater than 50%, or greater than 90% by volume nanoparticles.

A composite in accordance with the invention can be included in other products. For example, a composite can be included in a light-emitting device, a display, etc. Light emitting devices including semiconductor nanocrystals are described, for example, in U.S. Application No. 60/368,130, filed Mar. 29, 2002, which is incorporated by reference in its entirety.

Metallic nanoparticles can be prepared as described, for example, in U.S. Pat. No. 6,054,495, which is incorporated by reference in its entirety. The metallic nanoparticle can be a noble metal nanoparticle, such as a gold nanoparticle. Gold nanoparticles can be prepared as described in U.S. Pat. No. 6,506,564, which is incorporated by reference in its entirety. Ceramic nanoparticles can be prepared as described, for example, in U.S. Pat. No. 6,139,585, which is incorporated by reference in its entirety.

Narrow size distribution, high quality semiconductor nanocrystals with high fluorescence efficiency are first prepared using previously established literature procedures and used as the building blocks. See, C. B. Murray et al., J. Amer. Chem. Soc. 1993, 115, 8706, B. O. Dabbousi et al., J. Phys. Chem. B 1997, 101, 9463, each of which is incorporated by reference in its entirety. The organic, surface-passivating ligands are then exchanged to stabilize the nanocrystals in polar solvents and in the matrix. Each of the plurality of semiconductor nanocrystals includes the same or different first semiconductor material. Each first semiconductor material can be overcoated with a second semiconductor material. Each first semiconductor film has a first band gap and each second semiconductor material has a second band gap. The second band gap can be larger than the first band gap. Each nanocrystal can have a diameter of less than about 10 nanometers. The plurality of nanocrystals can have a monodisperse distribution of sizes.

The foregoing, and other aspects described herein all constitute embodiments of the present invention.

It is to be understood that both the foregoing general description and the following detailed description are exemplary and explanatory only and are not restrictive of the invention as claimed. Other embodiments will be apparent to those skilled in the art from consideration of the description, from the claims, and from practice of the invention disclosed herein.

DETAILED DESCRIPTION OF THE INVENTION

In accordance with one aspect of the invention, there is provided a composite comprising a first layer comprising a first material including nanoparticles dispersed therein, wherein the first material comprises a material capable of transporting charge, and a second layer comprising a second material. While not wishing to be bound by theory, it is believed that by dispersing nanoparticles, e.g., semiconductor nanocrystals, in a first material the emissive properties of the layer will be improved by reducing undesirable energy transfer effects due to the immediate proximity of the nanoparticles. In certain preferred embodiments, the distance between the nanoparticles can be controlled by modifying the chemical surface of the nanoparticles and utilizing a first material for which the chemical surface of the nanoparticles have a chemical affinity. In certain embodiments, a composite can be incorporated into a device by disposing a first layer including a first material including a dispersion of nanoparticles onto a layer of a device, followed by formation of a second layer comprising a second material (e.g., a charge transport material or charge blocking material) over the first layer. Alternatively, the composite can be pre-fabricated on a separate temporary release substrate and then transferred onto the device substrate by, e.g., known lamination techniques.

Chemically synthesized nanoparticles (nanoparticles), such as semiconductor nanocrystals or quantum dots, consist of 1-10 nm diameter particles decorated with a layer of organic ligands. See, C. B. Murray et al., Annu. Rev. Mat. Sci., 30, 545-610 (2000), which is incorporated in its entirety. These zero-dimensional structures show strong quantum confinement effects that can be harnessed in designing bottom-up chemical approaches to create complex heterostructures with electronic and optical properties that are tunable with the size of the nanocrystals. At the same time, as a result of the surrounding ligand shell, nanocrystals can be chemically manipulated as large molecules. In certain embodiments, such nanoparticles are preferably colloidal.

Nanoparticles may comprise one or more associated ligands. A ligand provides increased compatibility with organic compounds such as solvents and/or polymers (i.e., including the monomer(s) and/or oligomer(s) from which the polymers are prepared). As an example of increased compatibility, the ligand compound can stabilize a distribution of nanocrystals within a composition that will be polymerized to prepare a polymer. Prior to polymerization, the viscosity of such compositions is often insufficiently high to prevent aggregation and/or sedimentation of the distributed nanoparticles. Aggregate formation is generally undesirable because a composition having a uniform distribution of nanoparticles is desirable. The increased compatibility provided by the ligand compounds stabilizes the distribution of nanoparticles to the extent that aggregation and/or sedimentation is inhibited as compared to a distribution of nanoparticles without attached ligand compounds. In an example of preparing a polymer, once polymerization and/or crosslinking has proceeded to a sufficient extent, aggregation and/or sedimentation of the distributed nanoparticles is inhibited by the increased viscosity of the polymer.

In some cases, it may be desirable to exchange the ligand compound of a nanoparticle for another ligand compound. For example, a nanoparticle may be obtained commercially with a ligand compound unsuitable for increasing the compatibility of the nanoparticle with a particular first material. In such cases, the nanoparticles may be subjected to a ligand exchange reaction to remove the undesirable ligands and to provide the nanoparticle with other, more desirable ligand compounds. Alternately, if the nanoparticles do not have attached ligand compound(s), the nanoparticles can be reacted with a ligand compound.

A ligand compound can be attached to a nanoparticle by a ligand exchange reaction. Such reaction typically includes two basic steps, which may or may not be performed separately from one another: (1) dissociating the existing ligand compounds from the surface of the nanoparticle, and (2) associating the nanoparticle with one or more desired ligand compounds. The step of dissociating may comprise precipitation, or "crashing out," of the existing ligand compounds, e.g., by combining the nanoparticle with a solvent so as to disassociate the existing ligand compound from the nanoparticle. The solvent may be an organic solvent, such as a hydroxyalkyl compound, e.g., methanol. The solubility of the ligand compounds in preferred solvents is sufficiently low to precipitate the dissociated ligand compounds. The dissociation step may include isolating the now bare nanoparticle from the dissociated ligand compounds, e.g., by filtration, centrifugation, decanting, or the like, or a combination thereof.

The step of associating preferably comprises a mass exchange step, in which the nanoparticle is exposed to a solution having a molar excess of the desired ligand compound under conditions that cause the ligand compound to bond to the nanoparticle. The nanoparticle is preferably bare (e.g., with no ligand attached thereto) prior to the mass exchange step. The molar excess may be at least about a 5-fold excess, at least about a 10-fold excess, at least about a 20-fold excess, at least about a 25-fold excess, at least about a 30-fold excess, at least about a 50-fold excess, at least about a 75-fold excess, from about a 50-fold excess to about a 100-fold excess, or about a 90-fold excess. It should be noted that the reaction for reacting a ligand with a bare nanoparticle may be identical with the step of associating. Upon completion of the association step, any excess unassociated ligand compounds may be separated from the nanoparticle, e.g., by precipitation and separation. In certain embodiments, the two steps are carried out simultaneously, and the excess is repeated, e.g., from 1 to 5 times.

The chemical properties of the surrounding ligand shell can make the nanoparticles soluble within or reactive with a first material. The first material can be an inorganic material or an organic material. The surrounding ligand shell has exposed ligand moieties. When the exposed ligand moieties are chemically similar to the first material, the nanoparticles will have an affinity therefor. When the exposed ligand moieties and first material are chemically dissimilar, the nanoparticles will not have an affinity for the first material. The ligand moieties can have the formula:

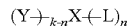

wherein k is 2, 3 4, or 5, and n is 1, 2, 3, 4 or 5 such that k-n is not less than zero; X is O, O—S, O—Se, O—N, O—P, O—As, S, S=O, SO2, Se, Se=O, N, N=O, P, P=O, C=O As, or As=O; each of Y and L, independently, is H, OH, aryl, heteroaryl, or a straight or branched C2-18 hydrocarbon chain optionally containing at least one double bond, at least one triple bond, or at least one double bond and one triple bond. The hydrocarbon chain being optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl and the hydrocarbon chain being optionally interrupted by —O—, —S—, —N($R^a$)—, —N($R^a$)—C(O)—O—, —O—C(O)—N($R^a$)—, —N($R^a$)—C(O)—N($R^b$)—, —O—C(O)—O—, —P($R^a$)—, or —P(O)($R^a$)—; and each of $R^a$ and $R^b$, independently, is hydrogen, alkyl, alkenyl, alkynyl, alkoxy, hydroxylalkyl, hydroxyl, or haloalkyl.

An aryl group is a substituted or unsubstituted cyclic aromatic group. Examples include phenyl, benzyl, naphthyl, tolyl, anthracyl, nitrophenyl, or halophenyl. A heteroaryl group is an aryl group with one or more heteroatoms in the ring, for instance furyl, pyridyl, pyrrolyl, or phenanthryl.

A suitable coordinating ligand can be purchased commercially or prepared by ordinary synthetic organic techniques, for example, as described in J. March, *Advanced Organic Chemistry*, which is incorporated by reference in its entirety.

The first material comprises a material that is capable of transporting charge. An example of a typical organic material capable of transporting holes includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other materials capable of transporting charge include spiro-TPD, 4-4'-N,N'-dicarbazolyl-biphenyl (CBP), 4,4-. bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, or an N,N,N',N'-tetraarylbenzidine.

In certain embodiments, the first material comprises a polymeric material that is capable of transporting holes. Examples of materials capable of transporting holes include, without limitation, polypyrrole, poly(phenylene vinylene), polyvinylcarbazole ("PVK"), (phenylmethyl)polysilane, poly(3,4-ethylenedioxythiophene) (PEDOT), polyaniline (PANI), fluorine, fluorenone, copolymers, such as those described in U.S. Pat. No. 6,864,339 of Uckert, oligo- and poly-difluorovinyl-(hetero)arylenes such as those described in U.S. Pat. No. 6,824,706 of Heeney et al., oligo- and poly-3-(1,1-difluoroalkyl)thiophenes such as those described in U.S. Pat. No. 6,806,374 of Heeney et al., oligo- and polymers of benzo[b]thiophene and 2,2'-bisbenzo[b]thiophenes such as those described in U.S. Pat. No. 6,695,978 of Heeney et al., fluorene-containing polymers such as those described in U.S. Pat. No. 6,605,373 of Woo et al., polymers with a molecular weight greater than 50,000, etc.

A material capable of transporting holes comprising an organic material may be intrinsic (undoped) or doped. Doping may be used to enhance conductivity. Examples of doped hole transport materials are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety. Other polymeric charge transport materials for use as a first material are known and can be readily identified by the skilled artisan.

As discussed above, in certain embodiments, the second material can comprise a material capable of transporting electrons. An example of a typical organic material that can be included in an electron transport material includes a molecular material. In certain embodiments the molecular material comprises an amorphous thin film. The molecular material can be non-polymeric. The molecular material can include a small molecule, for example, a metal complex. The metal complex of 8-hydroryquinoline can be an aluminum, gallium, indium, zinc or magnesium complex, for example, aluminum tris(8-hydroxyquinoline) ($Alq_3$). Examples of electron transport materials also include LT-N820 available from Luminescent Technologies, Taiwan. Other classes of materials capable of transporting electrons include metal thioxinoid compounds, oxadiazole metal chelates, triazoles, sexithiophenes derivatives, pyrazine, and styrylanthracene derivatives. A material capable of transporting charge comprising an organic material may be intrinsic (undoped) or doped. Doping may be used to enhance conductivity. See, for example, U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

As discussed above, in certain embodiments, the second material can comprise a material capable of transporting holes. An example of a typical organic material capable of transporting holes includes an organic chromophore. The organic chromophore can include a phenyl amine, such as, for example, N,N'-diphenyl-N,N'-bis(3-methylphenyl)-(1,1'-biphenyl)-4,4'-diamine (TPD). Other materials capable of transporting charge include spiro-TPD, 4-4'-N,N'-dicarbazolyl-biphenyl (CBP), 4,4-. bis[N-(1-naphthyl)-N-phenylamino]biphenyl (NPD), etc., a polyaniline, a polypyrrole, a poly(phenylene vinylene), copper phthalocyanine, an aromatic tertiary amine or polynuclear aromatic tertiary amine, a 4,4'-bis(p-carbazolyl)-1,1'-biphenyl compound, or an N,N, N',N'-tetraarylbenzidine. A material capable of transporting holes comprising an organic material may be intrinsic (undoped) or doped. Doping may be used to enhance conductivity. Examples of doped hole transport materials are described in U.S. Provisional Patent Application No. 60/795,420 of Beatty et al, for "Device Including Semiconductor Nanocrystals And A Layer Including A Doped Organic Material And Methods", filed 27 Apr. 2006, which is hereby incorporated herein by reference in its entirety.

Charge transport materials comprising organic materials and other information related to fabrication of organic charge transport layers are discussed in more detail in U.S. patent application Ser. Nos. 11/253,612 for "Method And System For Transferring A Patterned Material", filed 21 Oct. 2005, and 11/253,595 for "Light Emitting Device Including Semiconductor Nanocrystals", filed 21 Oct. 2005. The foregoing patent applications are hereby incorporated herein by reference in its entirety.

Organic charge transport materials may be disposed by known methods such as a vacuum vapor deposition method, a sputtering method, a dip-coating method, a spin-coating method, a casting method, a bar-coating method, a roll-coating method, and other film deposition methods. Preferably, organic layers are deposited under ultra-high vacuum (e.g., $\leq 10^{-8}$ torr), high vacuum (e.g., from about $10^{-8}$ torr to about $10^{-5}$ torr), or low vacuum conditions (e.g., from about $10^{-5}$ torr to about $10^{-3}$ torr). Most preferably, the organic layers are deposited at high vacuum conditions of from about $1 \times 10^{-7}$ to about $5 \times 10^{-6}$ torr. Alternatively, organic layers may be formed by multi-layer coating while appropriately selecting solvent for each layer.

As discussed above, in certain embodiments, the second material can comprise a material capable of blocking charge. Examples of charge blocking materials include electron blocking material, a hole blocking material, or an exciton blocking material. Examples of blocking material include, for example, 3-(4-biphenylyl)-4-phenyl-5-tert butylphenyl-1,2, 4-triazole (TAZ), 3,4,5-triphenyl-1,2,4-triazole, 3,5-bis(4-tert-butylphenyl)-4-phenyl-1,2,4-triazole, bathocuproine (BCP), 4,4',4"-tris{N-(3-methylphenyl)-Nphenylamino}triphenylamine (m-MTDATA), polyethylene dioxythiophene (PEDOT), 1,3-bis(5-(4-diphenylamino)phenyl-1,3,4-oxadiazol-2-yl)benzene, 2-(4-biphenylyl)-5-(4-tertbutylphenyl)-1,3,4-oxadiazole, 1,3-bis[5-(4-(1,1-dimethylethyl)phenyl)-1,3,4-oxadiazol-5,2-yl)benzene, 1,4-bis(5-(4-diphenylamino)phenyl-1,3,4-oxadiazol-2-yl)benzene, 1,3,5-tris[5-(4-(1,1-dimethylethyl)phenyl)-1,3,4-oxadiazol-2-yl)benzene, or 2,2',2"-(1,3,5-Benzinetriyl)-tris(1-phenyl-1-H-benzimidazole) (TBPi).

When the exposed ligand moieties and the first material are chemically similar, the nanoparticles can be dispersed within the first material. The nanoparticles having the ligand shell with exposed ligand moieties and a chemically similar first material can be dissolved in a mutual solvent to generate a film-forming solution. The solution can be deposited on a substrate, for example, by drop coating, dip coating or spin coating, to form a film. When dried, the film contains a layer of first material in which the nanoparticles are dispersed.

In certain embodiments, a solution comprising the first material and the nanoparticles can be applied to a substrate by, e.g., ink jet techniques, microcontact printing, or microgravure techniques.

Additional information and methods for depositing semiconductor nanocrystals are described in U.S. patent application Ser. Nos. 11/253,612 entitled "Method And System For Transferring A Patterned Material", filed 21 Oct. 2005, and 11/253,595 entitled "Light Emitting Device Including Semiconductor Nanocrystals", filed 21 Oct. 2005, each of which is hereby incorporated herein by reference in its entirety.

Other techniques, methods and applications that may be useful with the present invention are described in, U.S. Provisional Patent Application No. 60/792,170, of Seth Coe-Sullivan, et al., for "Composition Including Material, Methods Of Depositing Material, Articles Including Same And Systems For Depositing Material", filed on 14 Apr. 2006; U.S. Provisional Patent Application No. 60/792,084, of Maria J. Anc, For "Methods Of Depositing Material, Methods Of Making A Device, And System", filed on 14 Apr. 2006, U.S. Provisional Patent Application No. 60/792,086, of Marshall Cox, et al, for "Methods Of Depositing Nanomaterial & Methods Of Making A Device" filed on 14 Apr. 2006; U.S. Provisional Patent Application No. 60/792,167 of Seth Coe-Sullivan, et al, for "Articles For Depositing Materials, Transfer Surfaces, And Methods" filed on 14 Apr. 2006, U.S. Provisional Patent Application No. 60/792,083 of LeeAnn Kim et al., for "Applicator For Depositing Materials And Methods" filed on 14 Apr. 2006; U.S. Provisional Patent Application 60/793,990 of LeeAnn Kim et al., for "Applicator For Depositing Materials And Methods" filed by Express Mail on 21 Apr. 2006; U.S. Provisional Patent Application No. 60/790,393 of Seth Coe-Sullivan et al., for "Methods And Articles Including Nanomaterial", filed on 7 Apr. 2006; U.S. Provisional Patent Application No. 60/805,735 of Seth Coe-Sullivan, for "Methods For Depositing Nanomaterial, Methods For Fabricating A Device, And Methods For Fabricating An Array Of Devices", filed on 24 Jun. 2006; U.S. Provisional Patent Application No. 60/805,736 of Seth Coe-Sullivan et al., for "Methods For Depositing Nanomaterial, Methods For Fabricating A Device, Methods For Fabricating An Array Of Devices And Compositions", filed on 24 Jun. 2006; U.S. Provisional Patent Application No. 60/805,738 of Seth Coe-Sullivan et al., for "Methods And Articles Including Nanomaterial", filed on 24 Jun. 2006; U.S. Provisional Patent Application No. 60/795,420 of Paul Beatty et al., for "Device Including Semiconductor Nanocrystals And A Layer Including A Doped Organic Material And Methods", filed on 27 Apr. 2006; U.S. Provisional Patent Application No. 60/804, 921 of Seth Coe-Sullivan et al., for "Light-Emitting Devices And Displays With Improved Performance", filed on 15 Jun. 2006, and U.S. patent application Ser. No. 11/071,244 of Jonathan S. Steckel et al., for "Blue Light Emitting Semiconductor Nanocrystal Materials" 4 Mar. 2005 (including U.S. Patent Application No. 60/550,314, filed on 8 Mar. 2004, from which it claims priority). The disclosures of each of the foregoing listed provisional patent applications are hereby incorporated herein by reference in their entireties.

Preferably, the chemical characteristics of the first material and any ligand attached to a nanoparticle are chosen so that the material and nanoparticles do not undergo phase separation. For example, nanoparticles that would display a highly polar surface (e.g. OH groups) will not phase separate upon spin-coating if the other molecule is polar.

The solubility of the nanoparticles and the first material in the solvent can be on the order of 10 mg/mL to allow for a large range of possible solution mixtures and film thicknesses. Additionally, the first material can be selected to minimize phase separation with the nanoparticles.

A second material is formed over the layer comprising the first material and nanoparticles.

When a composite in accordance with the invention is included in a light emitting device, the device can further include two electrodes in electrical connection with the composite. The first material included in one layer can be chosen based on the material's ability to transport holes. The second material included in the other layer can be chosen based on the material's ability to transport electrons. In certain embodiments, the electron transport material can comprise an organic luminescent material. When a voltage is applied, one electrode injects holes (positive charge carriers) into the hole transport material, while the other electrode injects electrons into the electron transport material. The injected holes and electrons each migrate toward the oppositely charged electrode. When an electron and hole localize on the same molecule or nanoparticle, an exciton is formed, which can recombine to emit light.

A light emitting device can have a structure in which a first electrode, a composite comprising a first layer in contact with the first electrode, a second layer in contact with the first layer, and a second electrode in contact with the second layer. The first layer can comprise a hole transport material and second layer can comprise an electron transport material. One of the electrodes of the structure is in contact with a substrate. Each electrode can contact a power supply to provide a voltage across the structure. The first layer also includes a plurality of nanoparticles, for example, a substantially monodisperse population of nanoparticles. Electroluminescence can be produced by the emissive layer of the heterostructure when a voltage of proper polarity is applied across the heterostructure.

Emission from semiconductor nanocrystals can occur at an emission wavelength when one or more of the nanocrystals are excited. The emission has a frequency that corresponds to the band gap of the quantum confined semiconductor material. The band gap is a function of the size of the nanocrystal. Nanocrystals having small diameters can have properties intermediate between molecular and bulk forms of matter. For example, nanocrystals based on semiconductor materials having small diameters can exhibit quantum confinement of both the electron and hole in all three dimensions, which leads to an increase in the effective band gap of the material with decreasing crystallite size. Consequently, both the optical absorption and emission of nanocrystals shift to the blue (i.e., to higher energies) as the size of the crystallites decreases.

The emission from the nanocrystal can be a narrow Gaussian emission band that can be tuned through the complete wavelength range of the ultraviolet, visible, or infrared regions of the spectrum by varying the size of the nanocrystal, the composition of the nanocrystal, or both. For example, CdSe can be tuned in the visible region and InAs can be tuned in the infrared region. The narrow size distribution of a population of nanocrystals can result in emission of light in a narrow spectral range. The population can be monodisperse and can exhibit less than a 15% rms deviation in diameter of the nanocrystals, preferably less than 10%, more preferably less than 5%. Spectral emissions in a narrow range of no greater than about 75 nm, preferably 60 nm, more preferably 40 nm, and most preferably 30 nm full width at half max (FWHM) can be observed. The breadth of the emission decreases as the dispersity of nanocrystal diameters decreases.

Semiconductor nanocrystals can have high emission quantum efficiencies such as greater than 10%, 20%, 30%, 40%, 50%, 60%, 70%, or 80%. The semiconductor forming the nanocrystals can include, for example, a Group IIB-VIA compound, a Group IIB-VA compound, a Group IIIA-VIA compound, a Group IIIA-VA compound, a Group IVA-VIA compound, a Group IA-IIIA-VIA compound, a Group IIB-IVA-VIA compound, a Group IIB-IVA-VA compound, an alloy including any of the foregoing, and/or a mixture including any of the foregoing. Examples include, without limitation, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbS, PbSe, PbTe, etc.

A semiconductor material included in a semiconductor nanocrystal can be represented by the formula MX. In certain examples M comprises, for example, one or more elements from Group IA element (for example, lithium, sodium, rubidium, and cesium), Group IIA (for example, beryllium, magnesium, calcium, strontium, and barium), Group IIB (for example, Zn, Cd, or Hg), Group IIIA (for example, Al, Ga, In or Tl), Group IVA (for example, Ge, Sn or Pb), and/or the transition metals (for example, Ti, Zr, Hf, V, Nb, Ta, Cr, Mo, W, Mn, Tc, Re, Fe, Co, Ni, Pd, Pt, Rh, and the like). (See, F. A. Cotton et al., Advanced Inorganic Chemistry, 6th Edition, (1999). In certain examples, X comprises one or more elements from Group VA (for example, nitrogen, phosphorus, arsenic, antimony, and bismuth) and/or Group VIA (for example, oxygen, sulfur, selenium, and tellurium).

More detailed examples of materials suitable for inclusion in a semiconductor nanocrystal core include, but are not limited to, CdO, CdS, CdSe, CdTe, ZnO, ZnS, ZnSe, ZnTe, MgTe, GaAs, GaP, GaSb, GaN, HgO, HgS, HgSe, HgTe, InAs, InP, InSb, InN, AlAs, AlP, AlSb, AlN, PbO, PbS, PbSe, TlN, TlP, TlAs, TlSb, Ge, Si, an alloy including any of the foregoing, and/or a mixture including any of the foregoing.

Semiconductor material included in semiconductor nanocrystals may alternatively be represented by a formula based on the group(s) of the Period Table of Elements in which the elemental component(s) of the material is found, for example, as a Group IVA element, a Group IIB-VIA compound, a Group IIB-VA compound, a Group IIIA-VIA compound, a Group IIIA-VA compound, a Group IVA-VIA compound, a Group IA-IIIA-VIA compound, a Group IIB-IVA-VIA compound, or a Group IIB-IVA-VA compound, an alloy including any of the foregoing, and/or a mixture including any of the foregoing, including ternary and quaternary mixtures or alloys.

Examples of the shape of the semiconductor nanocrystals include sphere, rod, disk, other shape or mixtures thereof.

Preferably, the semiconductor nanocrystals preferably include a "core" of one or more first semiconductor materials, which may be surrounded by an overcoating or "shell" of a second semiconductor material. A semiconductor nanocrystal core surrounded by a semiconductor shell is also referred to as a "core/shell" semiconductor nanocrystal.

For example, a semiconductor nanocrystal core can comprise any of the semiconductor materials described above.

A shell can comprise a semiconductor material having a composition that is the same as or different from the composition of the core. The shell comprises an overcoat of a semiconductor material on at least a portion of the surface of the core. Examples include any of the semiconductor materials listed above.

In certain embodiments, the surrounding "shell" material can have a band gap greater than the band gap of the core material. In certain other embodiments, the surrounding shell material can have a band gap less than the band gap of the core material.

In certain embodiments, the shell can be chosen so as to have an atomic spacing close to that of the "core" substrate. In certain other embodiments, the shell and core materials can have the same crystal structure.

Examples of semiconductor nanocrystal (core)shell materials include, without limitation: red (e.g., (CdSe)ZnS (core) shell), green (e.g., (CdZnSe)CdZnS (core)shell, etc.), and blue (e.g., (CdS)CdZnS (core)shell.

Examples of methods of preparing monodisperse semiconductor nanocrystals include pyrolysis of organometallic reagents, such as dimethyl cadmium, injected into a hot, coordinating solvent. This permits discrete nucleation and results in the controlled growth of macroscopic quantities of nanocrystals. Preparation and manipulation of nanocrystals are described, for example, in U.S. Pat. No. 6,322,901, which is incorporated herein by reference in its entirety. The method of manufacturing a nanocrystal is a colloidal growth process. Colloidal growth occurs by rapidly injecting an M donor and an X donor into a hot coordinating solvent. The injection produces a nucleus that can be grown in a controlled manner to form a nanocrystal. The reaction mixture can be gently heated to grow and anneal the nanocrystal. Both the average size and the size distribution of the nanocrystals in a sample are dependent on the growth temperature. The growth temperature necessary to maintain steady growth increases with increasing average crystal size. The nanocrystal is a member of a population of nanocrystals. As a result of the discrete nucleation and controlled growth, the population of nanocrystals obtained has a narrow, monodisperse distribution of diameters. The monodisperse distribution of diameters can also be referred to as a size. The process of controlled growth and annealing of the nanocrystals in the coordinating solvent that follows nucleation can also result in uniform surface derivatization and regular core structures. As the size distribution sharpens, the temperature can be raised to maintain steady growth. By adding more M donor or X donor, the growth period can be shortened.

The M donor can be an inorganic compound, an organometallic compound, or elemental metal. M is cadmium, zinc, magnesium, mercury, aluminum, gallium, indium or thallium. The X donor is a compound capable of reacting with the M donor to form a material with the general formula MX. Typically, the X donor is a chalcogenide donor or a pnictide donor, such as a phosphine chalcogenide, a bis(silyl) chalcogenide, dioxygen, an ammonium salt, or a tris(silyl) pnictide. Suitable X donors include dioxygen, bis(trimethylsilyl) selenide ((TMS)$_2$Se), trialkyl phosphine selenides such as (tri-n-octylphosphine) selenide (TOPSe) or (tri-n-butylphosphine) selenide (TBPSe), trialkyl phosphine tellurides such as (tri-n-octylphosphine) telluride (TOPTe) or hexapropylphosphorustriamide telluride (HPPTTe), bis(trimethylsilyl)telluride ((TMS)$_2$Te), bis(trimethylsilyl)sulfide ((TMS)$_2$S), a trialkyl phosphine sulfide such as (tri-n-octylphosphine) sulfide (TOPS), an ammonium salt such as an ammonium halide (e.g., NH$_4$Cl), tris(trimethylsilyl) phosphide ((TMS)$_3$P), tris (trimethylsilyl) arsenide ((TMS)$_3$As), or tris(trimethylsilyl) antimonide ((TMS)$_3$Sb). In certain embodiments, the M donor and the X donor can be moieties within the same molecule.

A coordinating solvent can help control the growth of the nanocrystal. The coordinating solvent is a compound having a donor lone pair that, for example, has a lone electron pair available to coordinate to a surface of the growing nanocrystal. Solvent coordination can stabilize the growing nanocrystal. Typical coordinating solvents include alkyl phosphines, alkyl phosphine oxides, alkyl phosphonic acids, or alkyl phosphinic acids, however, other coordinating solvents, such as pyridines, furans, and amines may also be suitable for the nanocrystal production. Examples of suitable coordinating solvents include pyridine, tri-n-octyl phosphine (TOP), tri-n-octyl phosphine oxide (TOPO) and tris-hydroxylpropylphosphine (tHPP). Technical grade TOPO can be used.

Alternatively, a non-coordinating solvent can be used. Examples of suitable non-coordinating solvents include, but are not limited to, octadecene, squalane, squalene, octadecane, dioctyl ether, diphenyl ether, methyl myristate, octyl octanoate, hexyl octanoate, and octadecylamine.

Size distribution during the growth stage of the reaction can be estimated by monitoring the absorption line widths of the particles. Modification of the reaction temperature in response to changes in the absorption spectrum of the particles allows the maintenance of a sharp particle size distribution during growth. Reactants can be added to the nucleation solution during crystal growth to grow larger crystals. For example, for ZnS, CdSe, CdTe, PbSe, and InSb, by stopping growth at a particular semiconductor nanocrystal average diameter and choosing the proper composition of the semiconducting material, the emission spectra of the semiconductor nanocrystals can be tuned continuously over the wavelength range of 300 nm to 5 microns, or from 400 nm to 800 nm. The nanocrystal has a diameter of less than 150 Å. A population of nanocrystals has average diameters in the range of 15 Å to 125 Å.

The nanocrystal can be a member of a population of nanocrystals having a narrow size distribution.

For example, ZnS, ZnSe or CdS overcoatings can be grown on CdSe or CdTe semiconductor nanocrystals. An overcoating process is described, for example, in U.S. Pat. No. 6,322, 901. By adjusting the temperature of the reaction mixture during overcoating and monitoring the absorption spectrum of the core, over coated materials having high emission quantum efficiencies and narrow size distributions can be obtained. The overcoating may comprise one or more layers. The overcoating comprises at least one semiconductor material which is the same as or different from the composition of the core. Preferably, the overcoating has a thickness of from about one to about ten monolayers. An overcoating can also have a thickness greater than ten monolayers. In certain embodiments, more than one overcoating can be included on a core.

The particle size distribution can be further refined by size selective precipitation with a poor solvent for the nanocrystals, such as methanolibutanol as described in U.S. Pat. No. 6,322,901. For example, nanocrystals can be dispersed in a solution of 10% butanol in hexane. Methanol can be added dropwise to this stirring solution until opalescence persists. Separation of supernatant and flocculate by centrifugation produces a precipitate enriched with the largest crystallites in the sample. This procedure can be repeated until no further sharpening of the optical absorption spectrum is noted. Size-selective precipitation can be carried out in a variety of solvent/nonsolvent pairs, including pyridine/hexane and chloroform/methanol. The size-selected nanocrystal population can have no more than a 15% rms deviation from mean diameter, preferably 10% rms deviation or less, and more preferably 5% rms deviation or less.

The outer surface of the nanocrystal can include a layer of compounds derived from the coordinating solvent used during the growth process. The surface can be modified by repeated exposure to an excess of a competing coordinating group to form an overlayer. For example, a dispersion of the capped nanocrystal can be treated with a coordinating organic compound, such as pyridine, to produce crystallites which disperse readily in pyridine, methanol, and aromatics but no longer disperse in aliphatic solvents. Such a surface exchange process can be carried out with any compound capable of coordinating to or bonding with the outer surface of the nanocrystal, including, for example, phosphines, thiols, amines and phosphates. The nanocrystal can be exposed to short chain polymers which exhibit an affinity for the surface and which terminate in a moiety having an affinity for a suspension or dispersion medium and for the first material. Such affinity improves the stability of the suspension and discourages flocculation of the nanocrystal.

Transmission electron microscopy (TEM) can provide information about the size, shape, and distribution of the nanocrystal population. Powder x-ray diffraction (XRD) patterns can provided the most complete information regarding the type and quality of the crystal structure of the nanocrystals. Estimates of size are also possible since particle diameter is inversely related, via the X-ray coherence length, to the peak width. For example, the diameter of the nanocrystal can be measured directly by transmission electron microscopy or estimated from x-ray diffraction data using, for example, the Scherrer equation. It also can be estimated from the UV/Vis absorption spectrum.

Nanocrystals of CdSe coated with a ZnS passivation layer can have photoluminescence quantum efficiencies of as high as 50% or higher, matching that of the best organic lumophores. See, for example, Hines et al., J. Phys. Chem. 100, 468 (1996), which is incorporated by reference in its entirety. By changing the diameter of the CdSe core from 23 to 55 Å, the luminescence wavelength can be precisely tuned from 470 nm to 640 nm with a typical spectral full width at half of maximum (FWHM) of less than 40 nm. See, for example, Dabbousi et al., J. Phys. Chem. 101, 9463 (1997), which is incorporated by reference in its entirety. The narrow FWHM of nanocrystals can result in saturated color emission. This can lead to efficient nanocrystal-light emitting devices even in the red and blue parts of the spectrum, since in nanocrystal emitting devices no photons are lost to infrared and UV emission. The broadly tunable, saturated color emission over the entire visible spectrum of a single material system is unmatched by any class of organic chromophores. Furthermore, environmental stability of covalently bonded inorganic nanocrystals suggests that device lifetimes of hybrid organic/inorganic light emitting devices should match or exceed that of all-organic light emitting devices, when nanocrystals are used as luminescent centers. The degeneracy of the band edge energy levels of nanocrystals facilitates capture and radiative recombination of all possible excitons, whether generated by direct charge injection or energy transfer. The maximum theoretical nanocrystal-light emitting device efficiencies are therefore comparable to the unity efficiency of phosphorescent organic light emitting devices. The nanocrystal's excited state lifetime ($\tau$) is much shorter ($\tau \approx 10$ ns) than a typical phosphor ($\tau > 0.5$ μs), enabling nanocrystal-light emitting devices to operate efficiently even at high current density.

In one example of forming a composite in a device, a first material and semiconductor nanocrystals are mixed in a solvent in which they are miscible; the mixed solution is spin-cast on top of pre-cleaned ITO substrates. The first material and the ligand groups attached to the nanocrystal surfaces are selected to be chemically similar so that the nanocrystals with attached ligands are dispersed in the first material during and after evaporation of the solvent. The spin-casting is performed in a controlled (oxygen-free and moisture-free) environment in order to obtain highly reproducible heterostructures. A second layer comprising a second material is formed over the first layer. A metal electrode layer can then be deposited via thermal evaporation. Suitable solvents can be readily selected by the skilled artisan.

In such a device, holes are injected from the indium tin oxide (ITO) contact into the first layer. Similarly, electrons are injected from the Mg:Ag cathode into the Alq$_3$ and are transported to the nanocrystals included in the first layer.

In general, including nanocrystals in a first material, without experiencing significant layer separation, is governed by the interaction between any pair of materials with similar chemical functionality.

As used herein, "top" and "bottom" are relative positional terms, based upon a location from a reference point. More particularly, "top" means farthest away from the substrate, while "bottom" means closest to the substrate. For example, for a light-emitting device that optionally includes two electrodes, the bottom electrode is the electrode closest to the substrate, and is generally the first electrode fabricated; the top electrode is the electrode that is more remote from the substrate, on the top side of the light-emitting material. The bottom electrode has two surfaces, a bottom surface closest to the substrate, and a top surface farther away from the substrate. Where, e.g., a first layer is described as disposed or deposited "over" a second layer, the first layer is disposed farther away from substrate. There may be other layers between the first and second layer, unless it is otherwise specified. For example, a cathode may be described as "disposed over" an anode, even though there are various organic and/or inorganic layers in between.

As used herein, the singular forms "a", "an" and "the" include plural unless the context clearly +dictates otherwise. Thus, for example, reference to an emissive material includes reference to one or more of such materials.

Applicants specifically incorporate the entire contents of all cited references in this disclosure. Further, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

Other embodiments of the present invention will be apparent to those skilled in the art from consideration of the specification and practice of the invention disclosed herein. It is intended that the specification and examples be considered as exemplary only, with a true scope and spirit of the invention being indicated by the following claims and equivalents thereof.

What is claimed is:

1. A pre-fabricated composite consisting essentially of a layered arrangement of a first layer comprising semiconductor nanocrystals dispersed in a first material capable of transporting charge, a second layer comprising a second material capable of transporting charge, and a backing element that is removably attached to the uppermost layer of the composite or the lowermost layer of the composite, the backing element comprising a flexible sheet of material, wherein the first material capable of transporting charge and the second material capable of transporting charge are the same.

2. A pre-fabricated composite in accordance with claim 1 wherein at least a portion of the nanoparticles comprise a ligand attached thereto.

3. A pre-fabricated composite in accordance with claim 1 wherein the first layer is a discontinuous layer.

4. A pre-fabricated composite in accordance with claim 1 wherein at least one of the first layer and the second layer is patterned in a predetermined arrangement.

5. A pre-fabricated composite in accordance with claim 1 wherein the first layer is a continuous layer.

6. A pre-fabricated composite in accordance with claim 1 wherein at least one of the first layer and the second layer is unpatterned.

7. A pre-fabricated composite in accordance with claim 1 wherein the first material comprises a polymeric material.

8. A pre-fabricated composite in accordance with claim 1 wherein the first material comprises small molecules.

9. A pre-fabricated composite in accordance with claim 1 wherein a least a portion of the nanoparticles include a ligand attached to a surface thereof, wherein the ligand is represented by the formula:

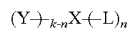

wherein k is 2, 3 4, or 5, and n is 1, 2, 3, 4 or 5 such that k-n is not less than zero; X is O, O—S, O—Se, O—N, O—P, O—As, S, S═O, SO2, Se, Se═O, N, N═O, P, P═O, C═O As, or As═O; each of Y and L, independently, is H, OH, aryl, heteroaryl, or a straight or branched C2-18 hydrocarbon chain optionally containing at least one double bond, at least one triple bond, or at least one double bond and one triple bond, the hydrocarbon chain being optionally substituted with one or more $C_{1-4}$ alkyl, $C_{2-4}$ alkenyl, $C_{2-4}$ alkynyl, $C_{1-4}$ alkoxy, hydroxyl, halo, amino, nitro, cyano, $C_{3-5}$ cycloalkyl, 3-5 membered heterocycloalkyl, aryl, heteroaryl, $C_{1-4}$ alkylcarbonyloxy, $C_{1-4}$ alkyloxycarbonyl, $C_{1-4}$ alkylcarbonyl, or formyl and the hydrocarbon chain being optionally interrupted by —O—, —S—, —N($R^a$)—, —N($R^a$)—C(O)—N($R^b$)—, —O—C(O)—O—, —P($R^a$)-, or —P(O)($R^a$)—; and each of $R^a$ and $R^b$, independently, is hydrogen, alkyl, alkenyl, alkynyl, alkoxy, hydroxylalkyl, hydroxyl, or haloalkyl.

10. A pre-fabricated composite in accordance with claim 1 wherein the first material comprises a material capable of transporting holes.

11. A pre-fabricated composite in accordance with claim 1 wherein the second material comprises a material capable of transporting electrons.

12. A pre-fabricated composite in accordance with claim 1 further including a removable sheet disposed over the side of the composite opposite the backing element.

13. A pre-fabricated composite in accordance with claim 1 wherein the flexible sheet comprises plastic, foil, or paper.

14. A pre-fabricated composite in accordance with claim 1 wherein at least a portion of the first layer is in direct contact with at least a portion of the second layer.

15. A pre-fabricated composite for inclusion between two electrodes of a device, the composite comprising a first layer comprising semiconductor nanocrystals dispersed in a first material, wherein the first material comprises a material capable of transporting charge, and a second layer comprising a second material disposed over the first layer, wherein a surface of the first layer forms a first external surface of the composite and a surface of the second layer forms a second opposite external surface of the composite, the composite being disposed on a surface of a backing element comprising a flexible sheet of material, wherein the first material and the second material are the same, and wherein at least a portion of the first layer is in direct contact with at least a portion of the second layer.

16. A pre-fabricated composite consisting essentially of a removable temporary release substrate, a first layer disposed over the temporary release substrate, a second layer disposed over the first layer, and a removable sheet disposed to form the surface of the composite opposite the temporary release substrate, wherein one of the first layer and second layer comprises semiconductor nanocrystals dispersed in a first material capable of transporting charge and the other one of the first layer and second layer comprises a second material capable of transporting charge, the temporary release substrate comprising a flexible sheet of material, wherein the first material and the second material are the same.

17. A pre-fabricated composite consisting essentially of a first layer and a second layer disposed over the first layer, wherein one of the first layer and second layer comprises semiconductor nanocrystals dispersed in a first material capable of transporting charge and the other one of the first layer and second layer comprises a second material capable of transporting charge, the composite being disposed on a surface of a backing element comprising a flexible sheet of material and further having a removable sheet disposed over the side of the composite opposite the backing element, wherein the first material and the second material are the same.

18. A pre-fabricated composite for transfer to a substrate of a device from a surface of a backing element comprising a flexible sheet of material, the composite comprising a first layer comprising semiconductor nanocrystals dispersed in a first material, wherein the first material comprises a material capable of transporting charge, and a second layer comprising a second material disposed over the first layer, wherein, after removal from the backing element, a surface of the first layer forms a first external surface of the composite and a surface of the second layer forms a second opposite external surface of the composite, wherein the first material and the second material are the same, and wherein at least a portion of the first layer is in direct contact with at least a portion of the second layer.

* * * * *